US00RE48398E

(19) United States
(12) Reissued Patent
Avdokhin et al.

(10) Patent Number: US RE48,398 E
(45) Date of Reissued Patent: Jan. 19, 2021

(54) PROCESS AND SYSTEM FOR UNIFORMLY CRYSTALLIZING AMORPHOUS SILICON SUBSTRATE BY FIBER LASER

(71) Applicant: IPG Photonics Corporation, Oxford, MA (US)

(72) Inventors: Alexey Avdokhin, Southborough, MA (US); Yuri Erokhin, Charlton, MA (US); Manuel Leonardo, Mountain View, CA (US); Alexander Limanov, Oxford, MA (US); Igor Samartsev, Westborough, MA (US); Michael von Dadelszen, Manchester, NH (US)

(73) Assignee: IPG PHOTONICS CORPORATION, Oxford, MA (US)

(21) Appl. No.: 16/535,316

(22) Filed: Aug. 8, 2019

Related U.S. Patent Documents

Reissue of:
(64) Patent No.: 9,941,120
Issued: Apr. 10, 2018
Appl. No.: 14/790,170
Filed: Jul. 2, 2015

U.S. Applications:
(60) Provisional application No. 62/020,501, filed on Jul. 3, 2014.

(51) Int. Cl.
*B23K 26/04* (2014.01)
*H01S 3/30* (2006.01)
(Continued)

(52) U.S. Cl.
CPC .. *H01L 21/02686* (2013.01); *H01L 21/02532* (2013.01); *H01S 3/06745* (2013.01);
(Continued)

(58) Field of Classification Search
CPC ..... H01L 21/02532; H01L 21/02686; H01S 3/06745; H01S 3/06754; H01S 3/094003; H01S 3/1618
See application file for complete search history.

(56) References Cited

U.S. PATENT DOCUMENTS 6,917,631 B2 * 7/2005 Richardson ..... H01S 3/06791 372/25
8,630,320 B2 * 1/2014 Munroe ..... B23K 26/0624 372/6

(Continued)

FOREIGN PATENT DOCUMENTS

WO WO2016004175 A1 * 1/2016 ..... H01L 21/02532

*Primary Examiner* — Deandra M Hughes
(74) *Attorney, Agent, or Firm* — Caroline J. Roush, Esq.; Yuri B. Kateshov, Esq.

(57) ABSTRACT

The inventive system for crystallizing an amorphous silicon (a-Si) film is configured with a quasi-continuous wave fiber laser source operative to emit a film irradiating pulsed beam. The fiber laser source is operative to emit a plurality of non-repetitive pulses incident on the a-Si. In particular, the fiber laser is operative to emit multiple discrete packets of film irradiating light at a burst repetition rate (BRR), and a plurality of pulses within each packet emitted at a pulse repetition rate (PRR) which is higher than the BRR. The pulse energy, pulse duration of each pulse and the PRR are controlled so that each packet has a desired packet temporal power profile (W/cm$^2$) and packet energy sufficient to provide transformation of a-Si to polysilicon (p-Si) at each location of the film which is exposed to at least one packets.

15 Claims, 3 Drawing Sheets

(51) Int. Cl.

| | |
|---|---|
| ***H01L 21/02*** | (2006.01) |
| ***H01S 3/067*** | (2006.01) |
| ***H01S 3/094*** | (2006.01) |
| ***H01S 3/16*** | (2006.01) |

(52) U.S. Cl.
CPC .... *H01S 3/06754* (2013.01); *H01S 3/094003* (2013.01); *H01S 3/1618* (2013.01)

(56) References Cited

U.S. PATENT DOCUMENTS 9,246,303 B1 * 1/2016 Rockwell ..... H01S 3/10007
9,413,137 B2 * 8/2016 Haden ..... H01S 5/0428
2007/0054443 A1 * 3/2007 Shimomura ..... B23K 26/067 438/149
2007/0178674 A1 * 8/2007 Imai ..... B23K 26/0604 438/487
2008/0262577 A1 * 10/2008 Altshuler ..... A61C 1/0046 607/89
2008/0267241 A1 * 10/2008 Brown ..... G03F 7/70025 372/55
2010/0135347 A1 * 6/2010 Deladurantaye .... H01S 3/06754 372/30
2010/0267173 A1 * 10/2010 Moffatt ..... B23K 26/0604 438/16
2010/0272129 A1 * 10/2010 Harter ..... H01S 3/1643 372/6
2011/0064095 A1 * 3/2011 Gapontsev ..... G02B 6/03611 372/6
2011/0086441 A1 * 4/2011 Kawaguchi ..... B23K 26/046 438/7
2011/0133129 A1 * 6/2011 Murakami ..... C23C 14/08 252/500
2013/0044768 A1 * 2/2013 Ter-Mikirtychev ..... H01S 3/06758 372/5
2013/0044788 A1 2/2013 Ter-Mikirtychev
2014/0050234 A1 * 2/2014 Ter-Mikirtychev ..... H01S 3/10007 372/6
2015/0131145 A1 * 5/2015 Rowen ..... H01S 3/06754 359/334
2015/0349481 A1 * 12/2015 Kliner ..... H01S 3/0675 359/341.3

* cited by examiner

Known art

Known art

Known art

FIG. 4
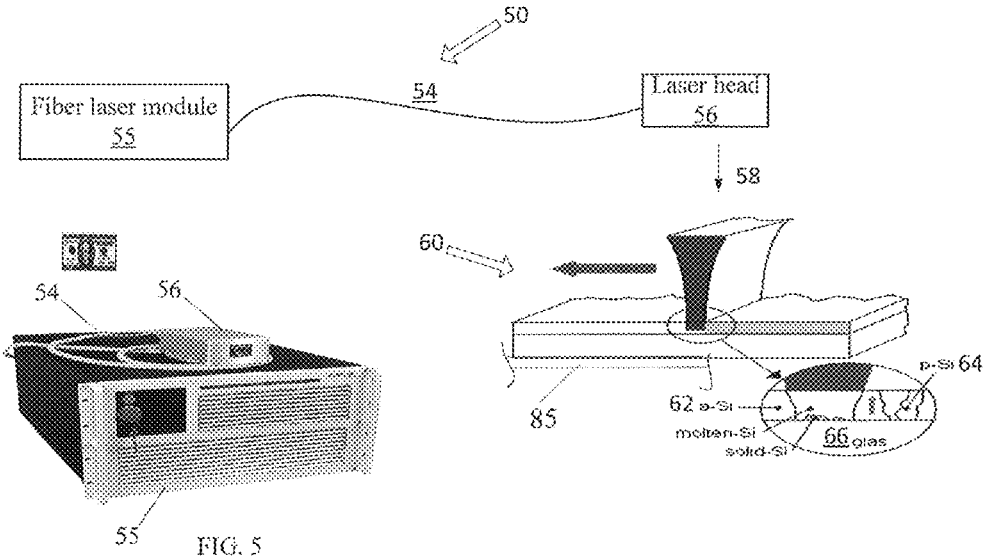
FIG. 5
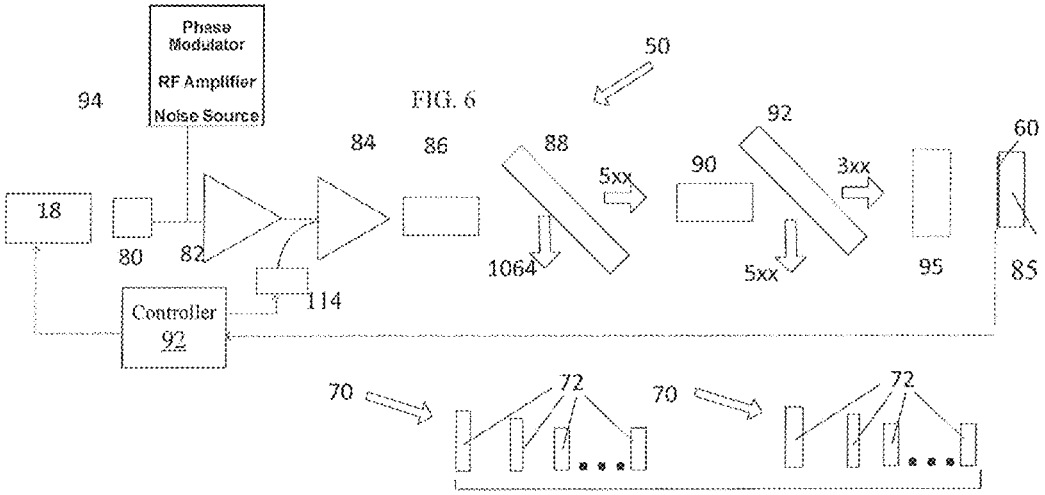
FIG. 6
FIG. 7
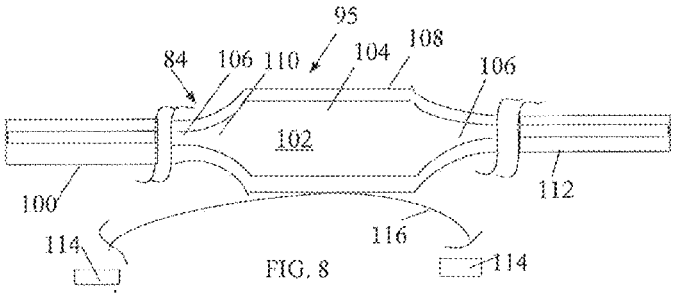
FIG. 8

FIG. 9
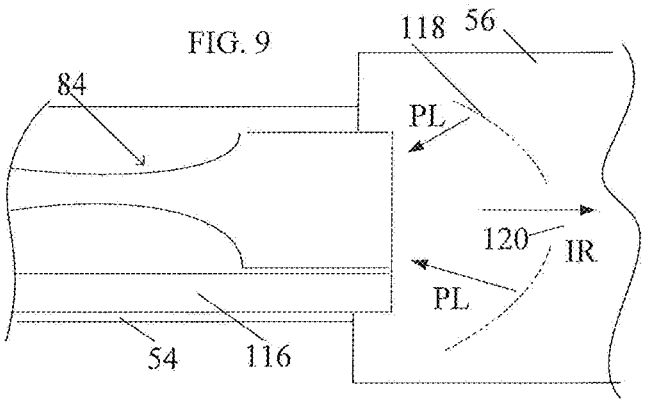
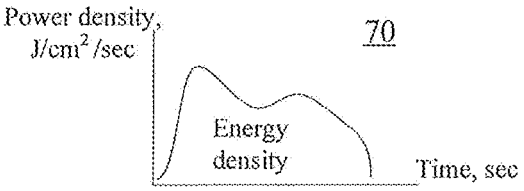
FIG. 10
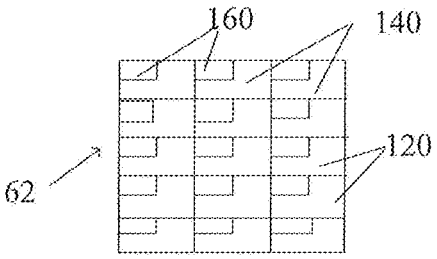
FIG. 11

PROCESS AND SYSTEM FOR UNIFORMLY CRYSTALLIZING AMORPHOUS SILICON SUBSTRATE BY FIBER LASER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

Field of the Invention

This disclosure relates to fabrication of flat panel displays. More particularly, the disclosure relates a fiber laser-based method and system configured to provide a substantially uniform polycrystalline structure by controllably annealing an amorphous silicon backplane with a laser beam from one or more fiber lasers.

Prior Art Discussion

The Flat Panel Display (FPD) fabrication environment is among the world's most competitive and technologically complex. Device designers and manufacturers continually strive to satisfy the worldwide consumer's appetite for higher resolution, brighter, larger displays, low power consumption and faster video capabilities for phones, PDAs and other compact products—all cost than the previous generation of technology.

The thin film transistor (TFT) technology is the basis for the FPD that can be either high-resolution, high-performance liquid crystal display (LCD), as shown in FIG. 1, or organic light emitting diode (OLED) FPD. The TFT display circuits are made on a thin semi-transparent layer of amorphous silicon ("a-silicon or a-Si") and arranged in a backplane across the layer to correspond to respective pixels.

The industry realized that using poly-silicon (poly-Si), which has the carrier mobility approximately two orders of magnitude greater than that of a-Si, substantially reduces the pixel size, improves the aperture ratio, and pixel resolution. As a result of these properties of poly-Si, portable/mobile electronic devices now feature high resolution flat panel displays.

There are two fundamentally different approaches for converting the a-Si into poly-Si through crystallization (annealing). One is a thermal annealing (TA) approach, and the other is a low-temperature poly-silicon annealing (LTPS) approach, which is of particular interest here. In the latter, a-Si is initially thermally treated to convert into liquid amorphous Si, and then it is maintained in the molten state for a certain period of time. The temperature range sufficient to maintain the molten state is selected to allow the initially formed poly-crystallites to grow and crystallize. The LTPS approach is based on two generic methods—Excimer Laser Annealing (ELA) and sequential lateral solidification (SLS), with the latter being the subject matter of the present disclosure.

In ELA, the excimer laser fires pulsed ultraviolet (UV) beam at 3xx nm wavelength directed at an a-Si film coated upon the substrate. The film is heated and melted at a thickness smaller than the full film thickness. The isolated islands of remaining a-Si on the bottom of the film serve as seeds for further crystal growth. The uniformity of resulting grains, which is the key to high performance of the end device, such as a flat screen, is achieved as a result of multiple irradiations of each location with the same fluence when scanning the film with at least 0.4 mm wide beam. Typically, at least 20 pulses are necessary to obtain the desired grain uniformity at each location of the film.

One of the basic issues driving the development of state of the art ELA is the manipulation of the intrinsically unstable condition of the lateral growth in such a way as to allow for more flexible control of film manufacturing. In this sense, multiple techniques, dealing with this issue, can be grouped together as controlled SLS.

In contrast to the above-discussed traditional ELA, the SLS includes melting the entire thickness of the a-Si film without seed-islands at the bottom of the film by a beam from an excimer laser. As a result, crystallization fronts grow from opposite sides of the molten film. In other words, the growth is lateral. The laterally developed crystalline grains can be elongated to large horizontal dimensions. The latter is advantageous since electron mobility increases as grains grow larger.

The lateral growth is accomplished by shifting the film coated substrate and laser beam relative to one another. The technique including irradiating each location of the film twice is known as a 2-shot SLS.

Historically, excimer lasers, used in both ELA and SLS processes, dominate annealing of TFT flat panel displays. Excimer lasers provide a wide range of processing power, with average range of processing powers up to 300 W and higher, energies higher than 1 J and pulse width typically ranging between 30 and 300 ns. Also, Excimers lasers deliver UV light at the wavelength (308 nm), which is directly absorbed in a-Si without additional frequency conversion.

The pulse frequency of the excimer laser is relatively low. To the best of Applicants' knowledge, it does not exceed 6 kHz in SLS processes and considerably lower in standard ELA. As to the SLS, with KHz frequencies leading to high energies, the excimer requires multiple gas changes over a day-long period of operation which makes it unsuitable for mass production.

The excimer-based annealing system is a large, cumbersome structure (FIGS. 2 and 3) costing anywhere from several hundred thousand to more than 10-15 millions of dollars on the market. In other words, it is expensive. In operation, the excimer is known for low uptime (or, conversely, high downtime) for a variety of reasons including, among others, frequent gas refills and subsequent adjustments. In addition to the latter, high maintenance cost also includes expensive and labor-extensive tube replacement once every few months.

A need therefore exists for replacing the excimer laser with a fiber laser source which is simple, inexpensive and requires a minimal or no maintenance at all.

SUMMARY OF THE DISCLOSURE

The inventive SLS process and laser-based system for annealing a-silicon films on glass, polymer, non-silicon crystal substrates are based on the use of one or more fiber lasers operable to transform a-Si film into a substantially uniform in size polycrystalline grain structure. The crystallization of each location of a-Si includes irradiating a location with multiple bursts or packets of UV light, wherein each burst is defined by multiple pulses emitted at a MHz pulse repetition rate which is incomparably higher than that of known Excimer lasers. With the pulse duration controllably varying in a 100 ps to 2 ns range and inter-pulse distance ranging between 3 and 20 ns, the atoms excited as a result of laser irradiation do not lose their mobility from pulse to pulse.

According to one aspect of the invention, the inventive system for crystallizing an amorphous silicon (a-Si) film is configured with a fiber laser source operative to emit a plurality of pulses at an irregular pulse repetition rate.

Another aspect of the disclosure is related to a controller operative to control the fiber laser source so as to emit a pulse line beam including multiple discrete packets of film irradiating light at a burst repetition rate (BRR), and a plurality of pulses within each packet emitted at a pulse repetition rate (PRR) which is higher than the BRR. The fiber laser source operates with a pulse energy, pulse duration of each pulse and the PRR so controllable that each packet has a desired packet temporal power profile ($W/cm^2$) and packet energy sufficient to provide transformation of a-Si to polysilicon (p-Si) at each location of the film which is exposed to at least one packet.

In accordance with one structural modification of the inventive system of the above-discussed aspects, the fiber laser source is configured with a master oscillator power fiber amplifier (MOPFA) optical scheme. The master oscillator functions as a seed outputting single mode (SM or low mode (LM) pump light at a fundamental frequency and selected from a single frequency (SF) diode laser or SF fiber laser. The power amplifier is configured as an ytterbium (Yb) doped booster operative to amplify the pump light at the fundamental wavelength in a 1 micron wavelength range. The system further includes a second harmonic generator (SHG) converting the fundamental wavelength of the pump light to a 5xx nm, such as 532 nm wavelength of light incident on the a-Si film the film irradiating light in.

In another structural modification of the system, a third harmonic generator (THG) is incorporated in the structures configured in accordance with both above-disclosed aspects. Located between the SHG and a-Si film, the THG is operative to convert the 5xx nm wavelength to a 3xx nm, such as 355 nm wavelength of the film irradiating light.

Still another structural modification of the inventive system in accordance with each of the above disclosed aspects includes pumping the power fiber amplifier in accordance with a side-pumping technique. Alternatively, the pumping scheme is configured so that pump light is coupled into the core end of the power amplifiers in a direction opposite to that of film irradiating light.

Yet another structural modification of the inventive system disclosed in each of the above-discussed aspects, the fiber amplifier has a double bottleneck-shaped cross-section or a bottleneck-shaped cross-section. The core of the power fiber amplifier may guide a plurality of transverse modes, but at the fundamental wavelength, the power fiber amplifier outputs film-irradiating light only in the fundamental mode.

The fiber laser source of each of the above-disclosed aspects is further configured with a linewidth broadening system to increase the threshold of deleterious nonlinear effects in the power fiber amplifier. Also the inventive system of both aspects is provided with a pulse picker controllably routing successive pulses to the desired location of the a-Si film.

A third aspect of the invention relates to a process for controllably annealing an amorphous silicon (a-Si) film which includes the inventive system of the above-disclosed aspects and their structural modifications. The inventive process includes emitting a succession of packets of light at a burst repetition rate (BRR), with the light being emitted at a fundamental wavelength, and emitting a plurality of light pulses within each burst at a pulse repetition rate (PRR), wherein the PRR being higher than the BRR. The inventive process further includes controlling the PRR and a pulse parameter of each pulse so as to provide each packet with a desired packet temporal power profile ($W/cm^2$) and desired packet energy. The desired temporal power profile and desired packet energy are sufficient to substantially uniformly crystallize the predetermined region of the a-Si layer with at least one packet of light incident on the film.

The inventive process according to a further aspect of the disclosure includes energizing the inventive fiber laser source so as to emit a plurality of pulses at a variable repetition rate, and directing the pulses to at least one predetermined region of the a-Si film to substantially uniformly crystallize the a-Si film.

One modification of the inventive method of third and final aspect of the disclosure relates to controlling a packet duty cycle, pulse duration, pulse amplitude, pulse duty cycle or any desired combination of the these parameters.

In accordance with another modification of both process-related aspects, the inventive process includes crystallizing the a-Si film in one of X and Y planes or both XY planes.

BRIEF DESCRIPTION OF THE DRAWINGS

The above and other aspects, features and advantages will become more readily apparent from the following specific description accompanied by the drawings, in which:

FIG. 4 is a diagrammatic view of the disclosed system;

FIG. 5 illustrates a laser source of the inventive system of FIG. 4;

FIG. 6 an optical schematic of the inventive laser source of FIG. 5;

FIG. 7 is a diagrammatic view of consecutive bursts of pulses emitted from the inventive laser source of FIGS. 4 and 5;

FIG. 8 is a diagrammatic view of the booster of the inventive laser source in accordance with one embodiment;

FIG. 9 is a diagrammatic view of the booster of the inventive laser source in accordance with another embodiment;

FIG. 10 illustrates a preferable shape of bursts of pulses; and

FIG. 11 is a plain view of an LCD backplane.

SPECIFIC DESCRIPTION

Figure 1:
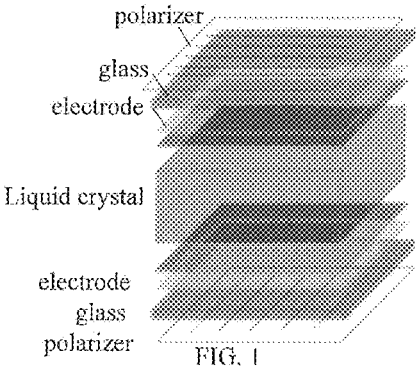
FIG. 1 is an exploded view of a flat screen.

Reference will now be made in detail to embodiments of the invention. Wherever possible, same or similar numerals are used in the drawings and the description to refer to the same or like parts or steps. The drawings are in simplified form and are not to precise scale. Unless specifically noted, it is intended that the words and phrases in the specification and claims be given the ordinary and accustomed meaning to those of ordinary skill in the diode and fiber laser arts. The word "couple" and similar terms do not necessarily denote direct and immediate connections, but also include mechanical and optical connections through free space or intermediate elements.

The basic goal of the present disclosure is to increase the productivity of silicon annealing processes including both standard ELA and SLS and greatly reduce the cost of manufacturing and operation of currently available annealing systems. The inventive annealing system is based on a fiber laser source specifically configured to carry out the above-mentioned processes. The goal is achieved by a system comprising a fiber laser source which emits a plurality of pulses at a variable repetition rate to substantially uniformly crystallize the a-Si layer.

FIGS. 4 and 5 show the basic layout of the inventive annealing system 50. In general, system 50 includes a laser source configured with a laser module 55 which houses a seed laser, optional one or more fiber preamplifiers, fiber booster, electronics, pumps and all other means which are necessary for the desired laser operation. In addition, system 50 includes a portable optical laser head 56 containing one or multiple higher harmonic generators converting a fundamental frequency of pump light to higher harmonics, guiding and focusing optics. A flexible cable 54 extends over free space while shielding an active fiber of booster stage which optically couples module 55 and optical head 56. Alternatively, flexible cable 54 may function as a standard delivery fiber with the booster housed within module 55 or in a separate module.

The focusing optics guides a pulsed laser output beam 58 at a substrate 60 which includes a glass layer or sub-substrate 66 supporting a-Si film 62. The collimated output line beam 58, dimensioned, for example, a 730×0.4 mm line beam annealing a-Si 62 so as to form substantially uniform grains of poly-silicon 64. The substrate 60 is secured to a translation stage 85 so that line beam 58 can be scanned across a surface of stationary a-Si film 62. Alternatively, substrate 60 with the film may be displaced relative to laser head 56. Still another possibility is to controllably displace both laser head 56 and substrate 60 relative to one another.

Figure 2:
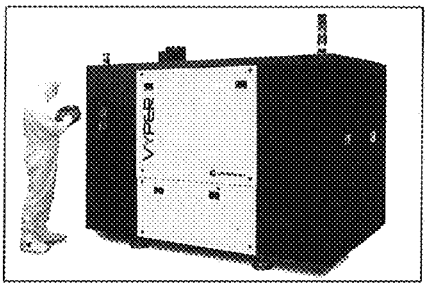
FIG. 2 is a diagrammatic representation of Excimer laser utilized in the LTPS process.
Figure 3:
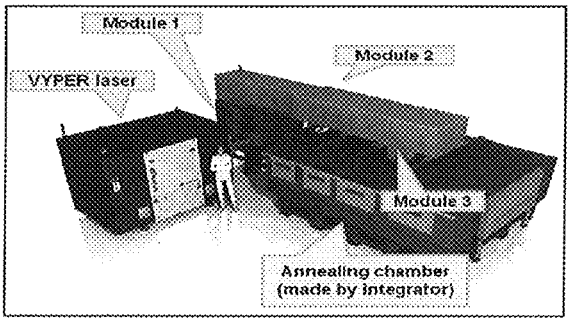
FIG. 3 is a view of a typical LTPS module incorporating the excimer laser of FIG. 2.

Referring now to FIG. 6, an exemplary fiber laser source implemented in system 50 of FIG. 4 is shown and discussed. The module 55 is compact and light. Suffice it to say that the module's size is comparable to a $20 bill shown in FIG. 6 to provide the viewer with a true appreciation of the module's compactness, particularly if one compares module 55 and the Excimer laser of FIG. 2 provided that output powers of respective laser sources are close to one another. The module 55 weighs only about 12 kg and has a 532×332×52 mm form factor.

Most of the applications of high-power "green" and UV-lasers are primarily benefited from a relatively high average power and relatively low peak power. These conditions are best met by a high repetition rate, high duty cycle quasi continuous wave (QCW) laser source 50.

The laser source has a master oscillator power fiber amplifier (MOPFA) architecture including a seed and at least one amplifying stage. A seed 80 may be selected from either diode or fiber lasers. While seed 80 may output low (transverse) mode IR light with $M^2$ of up to 2, exemplary seed 80, as shown in the drawings, is configured as a single transverse mode (SM) single frequency (SF) linearly polarized (LP) laser distributed feedback (DBF) semiconductor laser. The current at the input of seed laser 80 is directly modulated by a seed laser driver 18. The latter operates in response to a signal received from a controller 85 once the desired location to be annealed on mapped a-Si film 52 (FIG. 4) is determined in the known manner.

In accordance with one salient feature of the invention shown in FIG. 7, seed 80 is driven to output optical pulses at a non-uniform repetition frequency or rate. In particular, seed 80 outputs sequential packets of pulses 70 at a 1064 nm wavelength at a controllable burst repetition rate (BRR). However sequential pulses 72 within each packet are generated at a pulse repetition rate (PRR) different from the BRR.

The PRR is selected to be at most equal to, but preferably lower than the time constant of the crystallization process and may vary between 100 MHz and 200 (please verify) MHz. In the inventive crystallization process the time constant is roughly equal to 20 ns. Currently, a working model of system 50 operates at 150 MHz PRR. The pulse duration within the scope of this invention may controllably vary between 100 ps and about 2 ns. The duty cycle can also be controllably varied by controller 92 provided the inter-pulse duration does not exceed the time constant. Currently, the experimental system operates with a 1.3. ns pulse width and a time period between adjacent pulses of about 6.67 ns. The pulse width is easily adjustable by changing a PRR and a duty cycle. For example, with increasing the PRR and/or decreasing the duty cycle, the pulse width tends to decrease.

The duration of each individual packet may controllably vary between 30 *nanosecond* (ns) and 500 [μs] *ns*, with a 300 ns duration being sufficient to provide the desired uniformity of grains within the same irradiated region in two 300 ns bursts each having packet energy which varies between 50 and 200 μJ. The BRR is selected to meet two conditions: 1. The molten Si should solidify; and 2. The generated heat should be diffused in substrate 60 without damaging it. Both conditions are well met with a BRR ranging between about 75 KHz and about 1 MHz providing p-Si 64 with highly uniform grains along one of X and Y directions.

In summary, a pulse energy and pulse duration of each pulse and the PRR are controlled so that each packet has a desired packet temporal power profile ($W/cm^2$ per second) and packet energy sufficient to provide transformation of a-Si at each location of the film which is exposed to at least one packet of light. Both the temporal power profile and packet energy are easily measurable parameters as known to one of ordinary skill.

The infra-red (IR) light emitted from seed 80 at a fundamental wavelength is further sequentially amplified in one or more optional Ytterbium (Yb)-doped fiber preamplifiers 82 and Yb fiber booster 84 up to kW levels of average power. Both the single frequency and high powers of the amplified IR light lead to a high conversion efficiency of a frequency conversion scheme including a second harmonic generator (SHG) 86 and, if utilized, third harmonic generator 90. On the other hand, one of the limitations of high powers in fiber amplifiers and therefore high conversion efficiency is known to be, among others, stimulated Brillouin Scattering (SBS) which is an undesirable nonlinear phenomenon. Among a variety of approaches known to mitigate the effects of SBS, broadening the linewidth of seed 80 is often used to increase an SBS threshold in booster 86. Accordingly, system 50 further has a linewidth broadening system (LBS) 94 operative to increase an SBS threshold in the fiber amplifier to multi-kW level. The LBS 94 may be configured with a noise source, RF amplifier, and phase or amplitude modulator. Regardless of the type of the used modulator, the broadening system is configured to homogeneously broaden the single frequency linewidth of the light from seed 80 to a linewidth between 10 to 40 GHz.

Referring to FIG. 8 in addition to FIG. 6, booster 84 is operative to amplify the SF IR light at the fundamental wavelength up to a few kW peak power level, whereas an average power of IR light may be roughly ½ the peak power. As discussed above, booster 84 operates at kW-level peak powers but below the SBS threshold not only due to the broadened linewidth of light at the input of booster, 84 but also due the booster's configuration. In particular, Yb-doped active fiber 95 of booster 84 has a double bottleneck-shaped monolithic MM core 102 which however is configured to emit the radiation substantially in a single fundamental mode. In particular, MM core 102 includes identical input and output small diameter end regions 106 dimensioned to have a mode field diameter substantially matching that one of respective input and output passive SM fibers 100 and 112 which are fused to the opposite ends of active fiber 95. The MM core 102 is further configured with respective input and output mode transforming tapered regions 110 which flank a central amplifying region of the MM core that has a large uniform diameter greater than that of the end regions. The increased diameter of central region 104 decreases a power density of the guided light which increases the SBS threshold. A single or multiple claddings 108 can have the same cross-section as core 102, or may have a different cross-section, such as a standard cylindrically-shaped cross-section.

As shown in FIG. 8, booster 84 is side pumped. The booster's pump 114 may be configured with a plurality of MM current modulated diode lasers controllable by controller 94. The MM pump light delivery fiber 116 has a central segment running parallel to and coupled into a region of cladding 108 which surrounds amplifying core region 104.

FIG. 9 schematically illustrates alternative configurations of booster 84 and the end pumping scheme. Surrounded by flexible cable 54 (FIG. 4), booster 84 has monolithic MM core 102 of FIG. 8. The latter is configured with a single bottleneck-shaped cross section which expands toward the booster's downstream end mounted to laser head 56. The other, upstream end of the MM core is dimensioned so that when IR light is coupled into this end, only one fundamental mode is excited in MM core 102. One or multiple pump delivery pump fibers 116, guiding pump from pump 114 of FIG. 8, extend within cable 54 and may or may not be mechanically coupled to the expanded downstream end of booster 84. The pump light emitted from pump delivery fiber 116 is incident on a curved reflector 118 configured to guide the pump light in a counter-propagating direction PL relative to the direction of signal light IR into the distal end of core 102. The amplified IR light propagates through an opening 120 made in the reflecting element 118 in the light propagating direction.

Turning back to FIG. 6 in combination with FIGS. 4 and 8, controller 92 is configured to generate a signal coupled to the driver of pump 114 (FIG. 8) so as to modulate current at the input of pump diode lasers 114. Most of the time, the disclosed laser source operates with pump 114 (FIG. 8) working continuously. Yet one can readily realize a situation when the continuous pump operation is unnecessary and may even jeopardize the integrity of laser system 50. For example, if the BRR is too low, over-pumping of booster 84 may lead to devastating consequences. Periodic acceleration/deceleration of stage 85 (FIG. 4) may also be the reason for shutting down the operation of pump 114. For this and other situations requiring the stoppage of pump 114, controller 92 may generate a signal temporarily shutting down pump 114.

The pump 114 may also operate outputting pump light at a variable power in response to so a signal from controller 94. This allows varying the amplitude of individual pulses 72 within packet 70 which leads to the controllable adjustment of the total energy of individual pockets 70 and packets' respective temporal power profiles that can be seen in FIG. 10.

The amplified IR light is further incident on SHG 86 including a nonlinear LBO crystal which converts the amplified IR light at the fundamental wavelength in a single-pass SHG scheme to output Green light at, for example, a 532 nm wavelength at the average power ranging between several hundred watts and about 1.5 kW. Due to the inherent characteristics of silicon, it is possible that characteristics of Green light can be sufficient to crystallize a-Si film 62 of FIG. 4 and form p-Si film 64 in accordance with the established quality standards.

Alternatively, IR and Green light (e.g. at 5xx nm) beam continues propagation over free space through an optional upstream filter 88, realizing a pick-off to measure performance for active stabilization/trouble shooting, to impinge upon a third harmonic generator (THG) 90 which is also configured as a single pass scheme with an LBO crystal. The latter is configured to generate the third harmonic of the fundamental frequency utilizing sum frequency mixing to generate light in a UV range at about 355 nm wavelength. The fiber laser source of FIGS. 4, 6 and 7 operates with the wall plug efficiency between 15% and 30% in a 510-540 nm wavelength range.

The inventive system 50 of FIG. 6 may be configured with a packet picker/splitter 95 located downstream from either upstream filter 88 or downstream filter 92 which depends on whether system 50 operates in a 5xx nm wavelength range or 3xx wavelength range. This component may be utilized in numerous situations. As mentioned above, output powers tend to increase. The latter is most easily realized by increasing repetition rate of bursts. However, if the BRR is too high, the time between consecutive packets may be insufficient for the molten Si to sufficiently cool. Accordingly, using the packet picker, such as polygon or galvanometer mechanical tools, acousto-optical or electro-optical modulator, it is possible to reroute a second packet, which follows the original packet that has irradiated an initial region of the film, to irradiate a different region. Meanwhile, the original region may be irradiated by a packet subsequent to the second packet. The detailed description of these tools and their operation is part of the subject matter of U.S. Patent Application 62/186,013 filed concurrently with the present application.

Turning to FIG. 10 in combination with FIGS. 6 and 7, as disclosed above, the controlled parameters include, among others, pulse repetition rate, burst repetition rate, pulse and packet duty cycle, individual pulse intensity and therefore packet energy and its temporal power profile. Preferably each packet 70 is shaped to have a leading high power peak and a trailing low intensity peak.

FIG. 11 illustrates a high definition LCD which typically has an array of many millions solid-state shutters that transmit or block light from the backlight at each red, green or blue pixel 120. Each pixel has a transparent electrode that controls the actual liquid crystal material or transparent region 140. Each electrode is controlled by and shares opaque silicon area with a TFT 160 also referred to as a transistor region which blocks part of the light. The area ratio between the opaque TFT and other pixel transparent regions is one of the key metrics called the aperture ratio. In principle, only TFT areas 160 are to be crystallized, whereas the rest of a-Si 62 may remain intact. With the disclosed system 50, p-Si may be selectively formed so that the opaque/transparent area ratio varies between 1:1 to 1:5

Based on the foregoing, the productivity A of the disclosed fiber-based system 50, i.e. how many square meters $m^2$ of substrate 60 can be annealed per time unit, such as an hour, is radically higher than in the known LTPS ELA technique, provided the output power of both system 50 and known system is substantially the same, for example 1.2 kW. First of all, this is because the output of disclosed system 50 may be configured to irradiate each or selected areas of substrate 60 (FIG. 4) not 20 times, but substantially fewer times with at least one burst of pulses being sufficient to crystallize a-silicon. Then, based on experimental data, the laser-treated area of each transistor region may be reduced to about 50% compared to the area of transistor region in the LTPS ELA process. Overall, based on the above discussed factors increasing the productivity, it is believed that the productivity of the disclosed LTPS process An can be higher than that of the known LIPS ELA process (Ao) by a factor ranging between 10 and 20, i.e., An ~(10-20)Ao.

It will be apparent to those skilled in the art that various modifications and variations can be made in the presently disclosed fiber-laser-based annealing system. Thus, it is intended that the present disclosure cover the modifications and variations of this disclosure provided they come within the scope of the appended claims and their equivalents.

The invention claimed is:

1. A system for crystallizing an amorphous silicon (a-Si) film by sequential lateral solidification (SLS), comprising:

a quasi-continuous wave (QCW) fiber laser source operative to emit a pulsed line beam in an ultra-violet (UV) wavelength range and configured to have a master oscillator (MO) power fiber amplifier (MOPFA) optical scheme, the MO being directly modulated; and a controller operative to control the MO so as to emit:

multiple discrete packets of light at a burst repetition rate (BRR), each packet having a duration in a *nanosecond* (ns) range [and packet temporal power profile in a μJ/cm$^2$ range], and a plurality of ns pulses within each packet emitted at a pulse repetition rate (PRR) in a ns range which is higher than the BRR, wherein a pulse energy, pulse duration and the PRR are controlled so that each packet has a desired packet temporal power profile and packet energy sufficient to provide [crystalization] *crystallization* of a-Si to polysilicon (p-Si) at each location of the film which is exposed to at least two packets.

2. The system of claim 1, wherein the fiber laser source emits the pulses within each packet at the PRR ranging between 100 and 200 MHz, and the packets at the BRR varying between tens of KHz and about 1 MHz, and the packet [power profile] *energy* varies from 50 [μJ/cm$^2$] *μJ* to 200 [μJ/cm$^2$] *μJ*.

3. The system of claim 1, wherein the fiber laser controllably emits the packets having each a duration between [50] *30 ns* and 500 ns.

4. The system of claim 1, wherein the *MO of the* QCW fiber laser source [controllably] emits the *plurality of ns* pulses within each of the packets so that a time period between consecutive pulses is at most 20 ns.

5. The system of claim 1, wherein the *MO of the* QCW fiber laser source emits the light in single mode (SM) or low modes (LM) at a fundamental wavelength in a 1 μm wavelength range, the LM [pump] light having an M$^2$ value of up to 2;

the power amplifier being an ytterbium (Yb) doped fiber booster operative to amplify the light at the fundamental frequency so that a peak power of each packet is in a KW range and an average power of each packet is about half the peak power and reaches KW levels; and a second harmonic generator located downstream from the Yb fiber booster and operative to convert the fundamental wavelength of the light from the QCW fiber laser source to a first operating wavelength of a film irradiating light in a 5xx nm wavelength range.

6. The system of claim 5, wherein the fiber laser source further comprises a third harmonic generator located between the film and second harmonic generator and operative to convert the first operating wavelength of the film irradiating light to a second operating wavelength of the film irradiating light in a 3xx nm wavelength range.

7. The system of claim 1 further comprising a pump generating light which is coupled into the fiber booster in accordance with a side-pumping technique or end pumping technique, the pump including current-modulated MM diode lasers operatively connected to the controller.

8. The system of claim 7, wherein the fiber booster comprises an active fiber which has a monolithic multimode (MM) core surrounded by at least one cladding, the MM core being configured to support a single fundamental mode at the fundamental wavelength and having a double bottleneck-shaped cross section.

9. The system of claim 7, wherein the fiber booster comprises a monolithic core which is configured with a monolithic bottleneck-shaped cross section expanding towards a distal end of the fiber boosters, at least one cladding surrounding the core, a reflector opposing the distal end of the fiber booster and configured to reflect the light from the pump into the core in a direction which is counter to a direction of the pump light at the fundamental wavelength.

10. The system of claim 7 further comprising a linewidth broadening system coupled between the master oscillator and fiber booster and selected from an acousto-optical modulator or electro-optical modulator.

11. The system of claim 1 further comprising a packet picker selected from a polygon, galvanometer, acousto-optical or electro-optical modulator.

12. The system of claim 7, wherein the pump is configured to operate in a continuous regime or pulsed regime and output the light with a uniform power or controllably variable power so that the booster is operative to emit individual pulses with a uniform amplitude within each packet or non-uniform amplitude.

13. The system of claim 1, wherein the controller operates so that the film is selectively irradiated to have opaque areas, which correspond to exposed locations of the film, and transparent areas.

*14. A system for crystallizing an amorphous silicon (a-Si) film by sequential lateral solidification (SLS), comprising:*

*a quasi-continuous wave (QCW) fiber laser source operative to emit a pulsed line beam in an ultra-violet (UV) wavelength range and configured to have a master oscillator (MO) power fiber amplifier (MOPFA) optical scheme, the MO being directly modulated; and*

*a controller operative to control the MO so as to emit:*

*multiple discrete packets of light at a burst repetition rate (BRR), each packet having a duration in a ns range and a packet energy in a microjoule (μJ) range, and*

*a plurality of ns pulses within each packet emitted at a pulse repetition rate (PRR) in a ns range which is higher than the BRR, wherein a pulse energy, pulse duration and the PRR are controlled so that each packet has a desired packet temporal power profile and packet energy sufficient to provide crystalliza-*

*tion of a-Si to polysilicon (p-Si) at each location of the film which is exposed to at least one packet.*

*15. A system for crystallizing an amorphous silicon (a-Si) film by sequential lateral solidification (SLS), comprising:*

*a quasi-continuous wave (QCW) fiber laser source operative to emit a pulsed line beam in an ultra-violet (UV) wavelength range and configured to have a master oscillator (MO) power fiber amplifier (MOPFA) optical scheme, the MO being directly modulated; and*

*a controller operative to control the MO so as to emit:*

*multiple discrete packets of light at a burst repetition rate (BRR), each packet having a duration in a ns range, and*

*a plurality of ns pulses within each packet emitted at a pulse repetition rate (PRR) in a ns range which is higher than the BRR, wherein a pulse energy, pulse duration and the PRR are controlled so that each packet has a desired packet temporal power profile and packet energy sufficient to provide crystallization of a-Si to polysilicon (p-Si) at each location of the film which is exposed to at least one packet.*

* * * * *